(12) United States Patent
Mawatari

(10) Patent No.: US 9,324,934 B2
(45) Date of Patent: Apr. 26, 2016

(54) PIEZOELECTRIC THIN FILM, PIEZOELECTRIC ELEMENT, INK-JET HEAD, AND INK-JET PRINTER

(71) Applicant: KONICA MINOLTA, INC., Chiyoda-ku (JP)

(72) Inventor: Kenji Mawatari, Chiyoda-ku (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 14/382,813

(22) PCT Filed: Jan. 22, 2013

(86) PCT No.: PCT/JP2013/051114
§ 371 (c)(1),
(2) Date: Sep. 4, 2014

(87) PCT Pub. No.: WO2013/132903
PCT Pub. Date: Sep. 12, 2013

(65) Prior Publication Data
US 2015/0077474 A1    Mar. 19, 2015

(30) Foreign Application Priority Data
Mar. 6, 2012   (JP) ................... 2012-049107

(51) Int. Cl.
B41J 2/045 (2006.01)
H01L 41/187 (2006.01)
H01L 41/09 (2006.01)
H01L 41/316 (2013.01)
B41J 2/14 (2006.01)
C23C 14/08 (2006.01)
(Continued)

(52) U.S. Cl.
CPC ......... H01L 41/1876 (2013.01); B41J 2/14201 (2013.01); B41J 2/14233 (2013.01); C04B 35/491 (2013.01); C04B 35/62218 (2013.01); C23C 14/088 (2013.01); H01L 41/0973 (2013.01); H01L 41/316 (2013.01); B41J 2202/03 (2013.01); C04B 2235/3227 (2013.01); C04B 2235/768 (2013.01)

(58) Field of Classification Search
None
See application file for complete search history.

(56) References Cited

U.S. PATENT DOCUMENTS

2002/0142489 A1* 10/2002 Matsuura et al. .................. 438/3
2004/0104981 A1*  6/2004 Fujii et al. ........................ 347/71
(Continued)

FOREIGN PATENT DOCUMENTS

JP   04-159680   6/1992
JP   10-017398   1/1998
(Continued)

OTHER PUBLICATIONS

Search Report dated Aug. 17, 2015 which issued in the corresponding European Patent Application No. 13 757 891.1.
(Continued)

*Primary Examiner* — Erica Lin
(74) *Attorney, Agent, or Firm* — Cozen O'Connor

(57) ABSTRACT

A piezoelectric thin film which is of a perovskite type having a tetragonal crystal structure, the tetragonal crystal having a degree of (100) orientation of 80% or higher. The piezoelectric thin film is constituted of a lead lanthanum zirconate titanate (PLZT) which is a lead zirconate titanate (PZT) in which some of the lead has been replaced with lanthanum.

14 Claims, 13 Drawing Sheets

(51) Int. Cl.
*C04B 35/491* (2006.01)
*C04B 35/622* (2006.01)

(56) References Cited

U.S. PATENT DOCUMENTS

| | | |
|---|---|---|
| 2005/0218756 A1 | 10/2005 | Fujii et al. |
| 2006/0279178 A1 | 12/2006 | Ren |
| 2007/0097182 A1* | 5/2007 | Kubota et al. .......... 347/70 |
| 2008/0233277 A1 | 9/2008 | Kubota et al. |
| 2008/0278038 A1 | 11/2008 | Kobayashi et al. |

FOREIGN PATENT DOCUMENTS

| | | |
|---|---|---|
| JP | 2002-043641 | 2/2002 |
| JP | 2002-373791 | 12/2002 |
| JP | 2004-363557 | 12/2004 |
| JP | 2005-272294 | 10/2005 |
| JP | 2008-277672 | 11/2008 |
| JP | 2009-288806 | 12/2009 |

OTHER PUBLICATIONS

Office Action (and an English translation thereof) dated Jun. 30, 2015 which issued in the corresponding Japanese Patent Application No. 2014-503709.

Es-Souni et al. "Microstructure and properties of sol-gel processed $Pb_{1-x} La_x (Zr_{0.52}, Ti_{0.48})_{1-x/4} O_3$ thin films. The effects of lanthanum content and bottom electrodes", Thin Solid Films, vol. 389, Jun. 15, 2001, pp. 99-107.

Leng et al "Electrical and optical properties of lanthanum-modified lead zirconate titanate thin films by radio-frequency magnetron sputtering", Journal of Applied Physics, vol. 100, Issue 10, 2006, pp. 1-3.

* cited by examiner

XRD PATTERN

PIEZOELECTRIC THIN FILM, PIEZOELECTRIC ELEMENT, INK-JET HEAD, AND INK-JET PRINTER

RELATED APPLICATIONS

This is a U.S. National stage of International application No. PCT/JP2013/051114 filed on Jan. 22, 2013.

This patent application claims the priority of Japanese application no. 2012-049107 filed Mar. 6, 2012 the disclosure content of which is hereby incorporated by reference.

TECHNICAL FIELD

The present invention relates to a perovskite-type piezoelectric thin film, a piezoelectric element including the piezoelectric thin film, an ink-jet head including the piezoelectric element, and an ink-jet printer including the ink-jet head.

BACKGROUND ART

In recent years, as a mechano-electrical transducer for application to a driving element, a sensor, or the like, a piezoelectric body such as Pb(Zr, Ti)O$_3$ has been used. Such a piezoelectric body in the form of a thin film formed over a substrate of Si or the like is expected to be applied to MEMS (micro-electro-mechanical systems) elements.

In producing a MEMS element, high-precision processing using a semiconductor process technology such as photolithography can be used, thus allowing the element to be reduced in size and to have an increased packing density. Particularly by densely and collectively fabricating elements on a relatively large Si wafer such as of 6 inches or 8 inches in diameter, compared with a case of single wafer production in which elements are produced one by one, significant cost reduction can be achieved.

Furthermore, with a piezoelectric body used in the form of a thin film and a device formed in a MEMS configuration, mechano-electrical transduction efficiency is improved, and this has led further to creation of new added values such as improvements in sensitivity and characteristics of the device. For example, in a case of a thermal sensor, having the MEMS configuration, the thermal sensor is reduced in thermal conductance, so that a measurement sensitivity thereof can be increased, and in a case of an ink-jet head for a printer, nozzles thereof are provided at an increased packing density, so that high-definition patterning can be performed.

As a material of a piezoelectric body thin film (piezoelectric thin film), a crystal constituted of Pb, Zr, Ti, and O, which is referred to as PZT (lead zirconate titanate), is often used. PZT exhibits an excellent piezoelectric effect when having an ABO$_3$-type perovskite structure shown in FIG. 16 and thus should be used in a perovskite single-phase form. The shape of a unit cell of a crystal of PZT having the perovskite structure varies depending on a ratio between Ti and Zr, which are atoms to be in a B site. That is, when the content of Ti is large, PZT has a tetragonal crystal lattice, and when the content of Zr is large, PZT has a rhombohedral crystal lattice. When a molar ratio between Zr and Ti is in the vicinity of 52:48, both of these crystal structures are present, and a phase boundary at which this composition ratio is achieved is referred to as an MPB (morphotropic phase boundary). With such an MPB composition, piezoelectric characteristics such as a piezoelectric constant, a polarization value, and a dielectric constant are enhanced to the maximum, and thus a piezoelectric thin film having the MPB composition has been vigorously used.

When a piezoelectric thin film is used as a MEMS driving element, in order to meet a required level of displacement generating force, the piezoelectric thin, film needs to be formed in a thickness of 3 μm to 5 μm. As a method for forming the piezoelectric thin film over a substrate of Si or the like, there are known a chemical film formation method such as CVD, a physical method such as sputtering or ion plating, and a liquid phase growth method such as a sol-gel method, and it is important that conditions for obtaining a perovskite single-phase film are found so as to be suited to an adopted one of the film formation methods.

By the way, recent years have seen a demand for a MEMS driving element having a further increased packing density and a higher output. In order to realize such a driving element, there is demanded a piezoelectric thin film that, achieves a value (absolute value) of a piezoelectric constant $d_{31}$, which is an index to evaluate piezoelectric characteristics, of not less than 180 [pm/V].

In order, therefore, to realize a piezoelectric thin film having high piezoelectric characteristics, it has been studied to extend measures to enhance piezoelectric characteristics used for bulk ceramic to thin films. One of such measures to enhance piezoelectric characteristics is to control a polarization domain so as to utilize non-180° domain rotation.

A perovskite crystal of PZT or the like is a ferroelectric body having spontaneous polarization Ps when no voltage is applied thereto. A region in which a direction of the spontaneous polarization Ps is aligned is referred to herein as a polarization domain. A possible direction of the spontaneous polarization Ps varies depending on the shape of a unit cell of a crystal, and is a <100> axis direction when the unit cell is tetragonal and a <111> axis direction when the unit cell is rhombohedral. It is assumed that the <100> axis direction collectively refers to six equivalent directions in total, which are [100], [010], and [001] directions and directions opposite thereto. Furthermore, it is assumed that the <111> axis direction collectively refers to eight equivalent directions in total, which are [111], [-111], [1-11], and [-1-11] directions and directions opposite thereto. Incidentally, FIG. 17A shows a direction of spontaneous polarization Ps of a tetragonal crystal, and FIG. 17B shows a direction of spontaneous polarization Ps of a rhombohedral crystal.

As a non-180° domain, in a case of a tetragonal crystal, there exists, for example, a domain having polarization in the [100] direction inclined in terms of a polarization direction at an angle of 90° with respect to a domain having polarization in the [001] direction. Furthermore, in a case of a rhombohedral crystal, there exists, for example, a domain having polarization in the [-1-11] direction inclined in terms of a polarization direction at an angle of 71° with respect to a domain having polarization in the [111] direction. Among such domains, one having a maximum displacement amount is a 90°-rotated domain of the tetragonal crystal, and various studies for efficiently utilizing 90° domain rotation of the tetragonal crystal have been conducted. The following describes in detail the 90° rotation of the tetragonal crystal.

FIG. 18 shows a piezoelectric distortion ΔX1 that commonly occurs in a case where, with respect to the domain having polarization in the [001] direction of the tetragonal crystal, an electric field is applied in the [001] direction, and a piezoelectric distortion ΔX2 that occurs in a case where, with respect to the domain having polarization in the [100] direction of the tetragonal crystal, an electric field of the same magnitude is applied in the [001] direction. In this figure, each thick solid arrow indicates a polarization direction. As shown in this figure, the piezoelectric distortion ΔX2 resulting from 90° domain rotation from the [100] direction to the [001]

direction is larger than the piezoelectric distortion ΔX1 that commonly occurs. Thus, in a case where such 90° domain rotation of the tetragonal crystal can be caused efficiently every time an electric field is applied, piezoelectric characteristics can be enhanced. From this viewpoint, conceivably, in a tetragonal PZT film, by increasing a region that is a (100)-oriented domain, namely, a domain having polarization in the [100] direction, an effect of domain rotation can be significantly utilized, and thus a higher piezoelectric constant is obtained.

In a film in actual use, however, there often occurs so-called pinning of domains (locking of domains) in which even when the domain in the [100] direction, after being rotated once in a direction of an electric field so that its polarization direction is turned to the [001] direction, is released from application of the electric field, the domain is not turned back into the [100] direction, which is its original polarization direction, so that a crystal is turned into a (001)-oriented crystal. Because of this, when an electric field is applied for the second and following times, there exists a region in which no displacement by domain rotation occurs, resulting in a decrease in displacement.

In order to solve this, for example, in Patent Document 1, based on a finding that pining of domains is caused by a lead atom in a composition, PZP having a lead-deficient film composition is used so as to suppress pinning of domains in an attempt to, in a (100)-oriented tetragonal PZT film, effectively utilize domain rotation, thereby obtaining high piezoelectric characteristics.

Furthermore, energy required to generate a distortion resulting from 90° domain rotation is higher than energy required to generate a piezoelectric distortion that commonly occurs, and thus even if a (100) single-oriented tetragonal PZT film is obtained, a device driving voltage that is commonly used is not sufficient to cause 90° domain rotation therein.

In order to solve this, for example, in Patent Document 2, as a piezoelectric body, a (100) single-oriented film whose orientation axis is inclined from a direction perpendicular to a substrate is formed, and thus non-180° domain rotation is caused reversibly and efficiently (by using a low electric field), so that high piezoelectric characteristics are obtained.

LIST OF CITATIONS

Patent Literature

Patent Document 1: JP-A-2002-43641 (see claim 2, paragraphs [0004] to [0006], [0011], [0012], etc.)
Patent Document 2: JP-A-2008-277672 (see claims 1 and 6, paragraphs [0039], [0062], [0063], FIG. 4, etc.)

SUMMARY OF THE INVENTION

Technical Problem

By the way, Patent Document 1 uses a lead-deficient film composition. In this connection, when a lead atom is lost from a crystal, it becomes likely that, at that time, in an attempt to maintain electric charge neutrality, an oxygen atom is lost from the crystal, as a result of which oxygen defects occur. That is, in the crystal, a Pb atom is present in a bivalent cation state, and an O atom is present in a bivalent anion state. When the Pb atom is lost from the crystal, the crystal as a whole becomes electrically negative. With the O atom being lost therefrom, the crystal becomes electrically neutral and thus is stabilized, it is known that a lead atom, in particular, has a low Vapor pressure and thus is extremely likely to be evaporated when a PZT film is formed at a high temperature of about 500° C. to 700° C. This makes it likely that lead deficiency further grows to bring about more oxygen defects.

In Patent Document 1, as noted above, for the purpose of suppressing pinning of domains, PZT having a lead-deficient film composition is used. In PZT having a lead-deficient composition, an electric charge balance of ions in the crystal collapses to fail to maintain electric charge neutrality, so that oxygen defects are induced as described above. Herein, when oxygen defects occur in the crystal, it becomes difficult to suppress, pinning of domains, and hence using a lead-deficient film composition as in Patent Document 1, in fact, results in the occurrence of oxygen defects, rather making it difficult to suppress pinning of domains.

Furthermore, the occurrence of oxygen defects leads to a phenomenon such as deterioration in leakage characteristic, resulting in another problem that long-term reliability is decreased.

Furthermore, in Patent Document 2, in order to reversibly and efficiently cause non-180° domain rotation, it is required that a specific type of substrate (a single crystal substrate with a surface on which a crystal plane is inclined) be used, and a piezoelectric body be formed on the surface of this substrate so that an orientation axis of the piezoelectric body is inclined from a direction perpendicular to the substrate. In this case, since the piezoelectric body has anisotropy, in fabricating a device in a later process step, it becomes difficult to perform processing (patterning) in a uniform manner by wet etching or the like, thus decreasing device productivity.

The present invention has been made to solve the above-described problems and has as its object to provide a piezoelectric thin film that suppresses pinning of domains so as to reversibly and efficiently cause 90° domain rotation of a tetragonal crystal, thus achieving enhanced piezoelectric characteristics, maintains excellent reliability for a long period of time, and can suppress a decrease in device productivity, a piezoelectric element including the piezoelectric thin film, an ink-jet head including the piezoelectric element, and an ink-jet printer including the ink-jet head.

Solution to the Problem

According to one aspect of the present invention, there is provided a perovskite-type piezoelectric thin film having a crystal structure of a tetragonal crystal, in which a (100) orientation degree of the tetragonal crystal is 80% or higher and that is made of PLZT obtained by substituting La for a part Pb in PZT.

According to the above-described configuration, in the piezoelectric thin film, the (100) orientation degree of the tetragonal crystal is 80% or higher, and thus it is possible to increase an effect of significantly enhancing piezoelectric characteristics by utilizing 90° domain rotation of the tetragonal crystal.

Furthermore, PLZT is used to form the piezoelectric thin film, and thus oxygen defects can be suppressed. That is, since La is substituted for a part of Pb in PZT, even in a case where lead deficiency occurs when the piezoelectric thin film is formed at a high temperature, it becomes unlikely that oxygen defects result therefrom. To be specific, in a perovskite crystal, an La atom is present in a trivalent cation state, and a Pb atom is present in a bivalent cation state, and thus compared with PZT, PLZT has a larger amount of positive electric charge. Because of this, even in a case where an O atom is not lost, while the Pb atom is lost through evaporation when the piezoelectric thin film is being formed at a high temperature, it becomes easier for the crystal to maintain electric charge neutrality.

As described above, it becomes unlikely that oxygen defects occur in the crystal, and thus pinning of domains resulting from the oxygen defects can be suppressed. This makes it possible to reversibly cause 90° domain rotation. In addition, it has been found by quantum computation that, in (100)-oriented PLZT, compared with PZT, energy required to cause 90° domain rotation is lower. Thus, 90° domain rotation can be caused efficiently.

That is, according to the above-described configuration, also in a case of utilizing 90° domain rotation of a tetragonal crystal, it is possible to reversibly and efficiently cause the 90° domain rotation and thus to enhance piezoelectric characteristics. Furthermore, it becomes unlikely that oxygen defects occur in the crystal, and thus deterioration in leakage characteristic is prevented, so that excellent reliability can be secured for a long period of time.

Furthermore, the piezoelectric thin film is made of PLZT, and thus even with a high (100) orientation degree, 90° domain rotation can be caused reversibly and efficiently as described above. Thus, also in a case of forming a device (piezoelectric element) by forming the above-described piezoelectric thin film over a substrate, unlike in a conventional case, there is no need to use a specific type of substrate (a single crystal substrate with a surface on which a crystal plane is inclined) so that an orientation axis is inclined. Consequently, no anisotropy occurs in a piezoelectric body, and this enables uniform patterning by etching, so that a decrease in device productivity can be suppressed.

Advantageous Effects of the Invention

According to the above-described configuration, also in a case of utilizing 90° domain rotation of a tetragonal crystal, it is possible to reversibly and efficiently cause the 90° domain rotation and thus to enhance piezoelectric characteristics, and it is also possible to suppress deterioration in leakage characteristic and thus to secure excellent reliability for a long period of time. Furthermore, there is no need, at the time of fabricating a device, to use a specific type of substrate so that an orientation axis of the piezoelectric thin film is inclined, and thus a decrease in device productivity can be suppressed.

DESCRIPTION OF EMBODIMENT

Based on the appended drawings, one embodiment of the present invention will be described as follows.

(Key Factors for Enhancing Piezoelectric Characteristics)

In a piezoelectric thin film, in order to, efficiently utilize 90° domain rotation of a tetragonal crystal, it is crucial to suppress pinning of domains as noted above and to reduce energy required for the 90° domain rotation.

It has been found that whether or not pinning of domains occurs is largely affected by oxygen defects in a crystal. By reducing the oxygen defects, pinning of domains can be suppressed, and a large piezoelectric displacement by reversible 90° domain rotation can be obtained. At this time, an amount of oxygen defects in the film can hardly be reduced by a mere ingenious change to the method for forming the piezoelectric thin film.

Various studies in this regard have reached a finding that, by adding La (lanthanum) to PZT, it is possible to reduce an amount of oxygen defects in the film and to reduce energy required for polarization rotation, so that 90° domain rotation can be easily caused.

Figure 1:
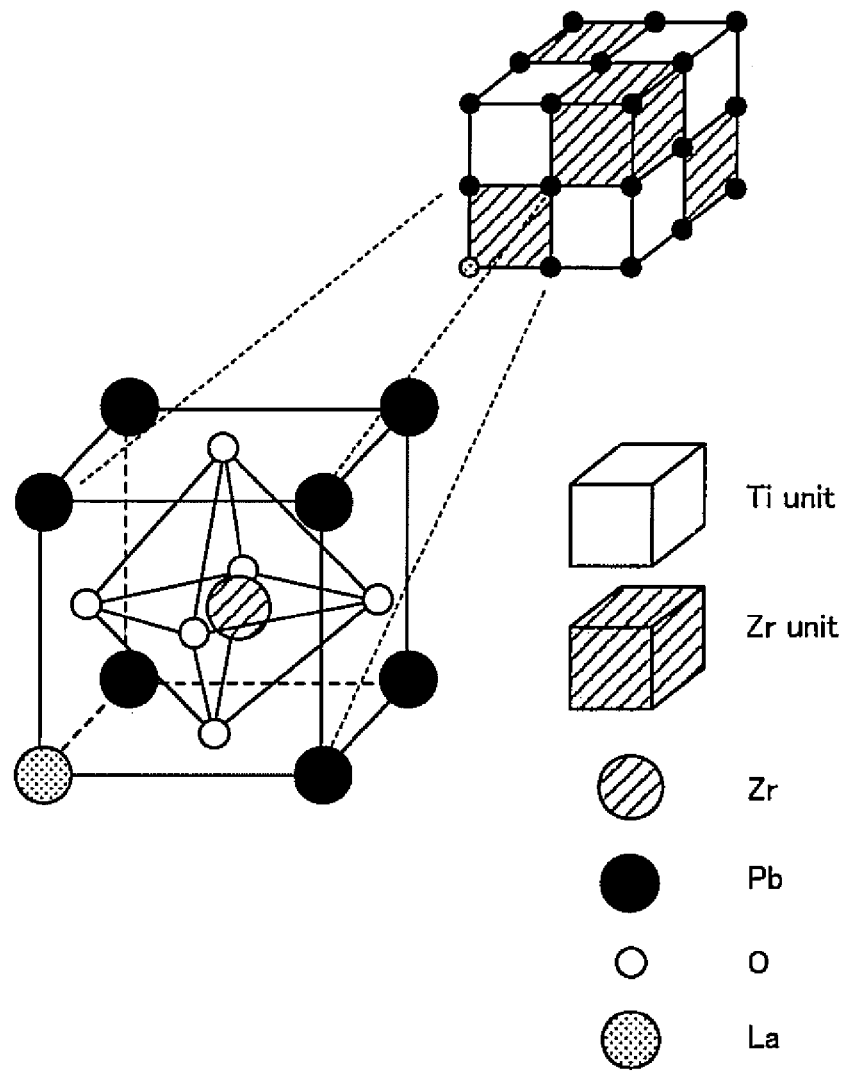
FIG. 1 is a perspective view schematically showing a crystal structure of PLZT used to form a piezoelectric thin film according to one embodiment of the present invention.
Figure 16:
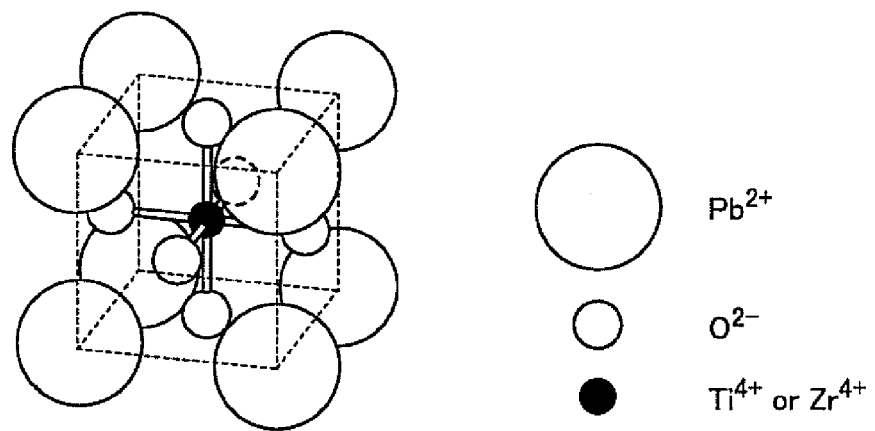
FIG. 16 is an explanatory view schematically showing a crystal structure of PZT.
Figure 17A:
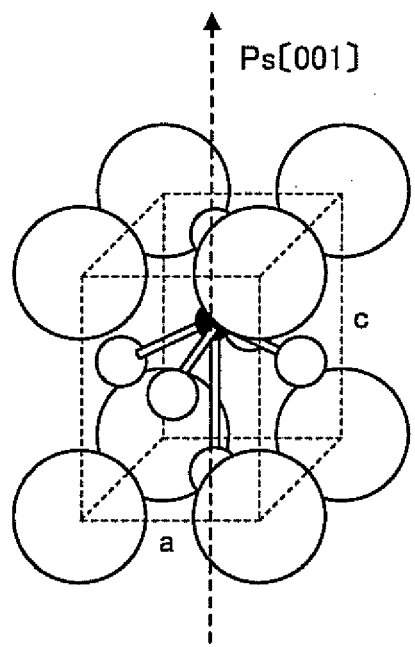
FIG. 17A is an explanatory view showing a polarization direction of a tetragonal crystal.
Figure 17B:
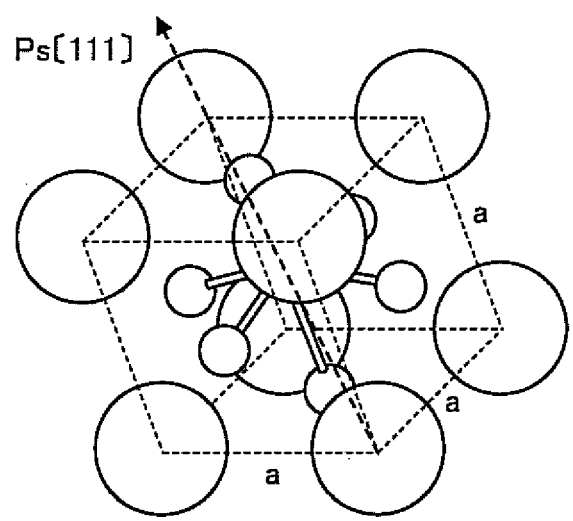
FIG. 17B is an explanatory view showing a polarization direction of a rhombohedral crystal.
Figure 18:
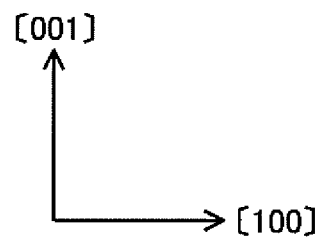
FIG. 18 is an explanatory view showing, in a tetragonal crystal, a piezoelectric distortion that commonly occurs and a piezoelectric distortion resulting from 90° domain rotation.
Figure 18:
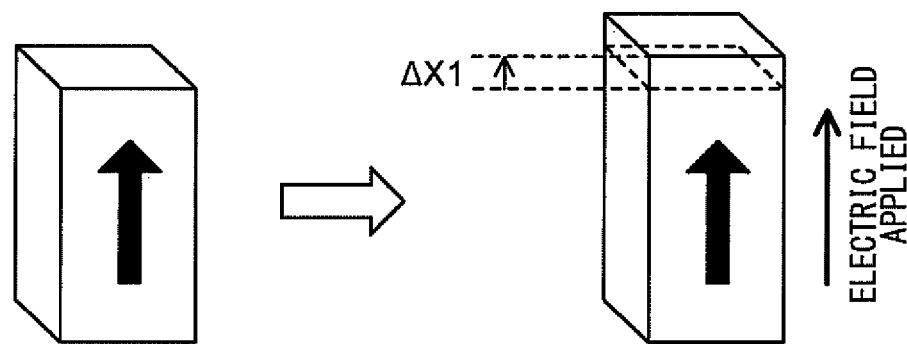
Figure 18:
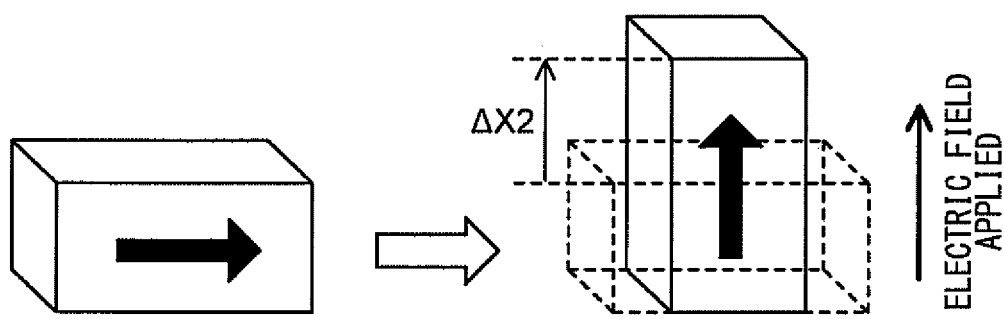

That is, when La is added to PZT, as shown in FIG. 1, La is substituted for a part of Pb located in an A site of a perovskite structure (see FIG. 16). At that time, in a perovskite crystal, La is present in a trivalent cation state, and Pb is present in a bivalent cation state, so that compared with PZT, to which La has not been added, PLZT (lead lanthanum zirconate titanate), to which La has been added, has an increased amount of positive electric charge. Conceivably, for this reason, even in a case where lead deficiency occurs when film formation is performed at a high temperature, it becomes unlikely that oxygen defects occur.

In order to demonstrate this theory, crystal models of PLZT, to which La had been added, and PZT, to which La had not been added, were created, and with respect to each of these models, energy $\Delta E$ (eV) required to generate oxygen defects was calculated by quantum computation. Herein, where energy of a crystal in a complete crystal state, namely, energy of the crystal being stable without losing any atom is indicated by $E_1$ (eV), energy of the crystal in an oxygen-deficient state, namely, energy of the crystal in a state of having lost an oxygen atom as $E_2$ (eV), and energy required for the oxygen atom that has been lost from the crystal to form a molecule as $E_3$ (eV), the above-described $\Delta E$ is expressed by an equation below:

$$\Delta E = E_1 - E_2 - (1/2) \times E_3.$$

The calculation of $\Delta E$ by using this equation gave a result that PLZT had a value of $\Delta E$ of 578 eV, whereas PZT had a value of $\Delta E$ of 5.32 eV, explaining that PLZT requires larger energy for generating oxygen defects, i.e. oxygen defects are less likely to be generated in PLZT.

Furthermore, also by using a model of an assembly of eight crystals each having a composition ratio of Pb:(Ti, Zr):O=1:1:3, it can be explained that oxygen defects are less likely to occur.

To be specifics the above-described crystal model has a composition ratio of Pb:(Ti, Zr):O=8:8:24. Assuming that La is substituted for a part of Pb and thus the composition ratio is changed to La:Pb:(Ti, Zr):O=2:6:8:24 is achieved, since an La ion has a valence (+3) larger than a valence (+2) of a Pb ion, this crystal has an increased amount of positive electric charge. That is, since La, Pb, Ti (or Zr), and O have valences of +3, +2, +4, and −2, respectively, a total amount of electric charge is $2\times(+3)+6\times(+2)+8\times(+4)+24\times(-2)=+2$. This means that this crystal has become electrically positive.

When one Pb atom is lost from this state, so that the composition, ratio is changed to La:Pb:(Ti, Zr):O=2:5:8:24, a total amount of electric charge is $2\times(+3)+5\times(+2)+8\times(+4)+24\times(-2)=0$, and thus this crystal has become electrically neutral. This means that when one Pb atom has been lost, even in a case where an O atom is not lost, electrical neutrality is maintained. Also from this, it is understood that oxygen defects are less likely to occur.

With respect further to each of crystal models of (100)-oriented PLZT and (100)-oriented PZT, energy required for 90° domain rotation was determined by quantum computation, which found that PLZT had a value of 0.032 eV, whereas PZT had a value of 0.064 eV. This has revealed that the addition of La to PZT allows 90° domain rotation to be caused by using half an amount of energy required in a case of PZT.

As is understood from the above, when PLZT obtained by substituting La for a part of Pb in PZT is used as a piezoelectric body and is formed into a (100)-oriented piezoelectric thin film having a crystal structure of a tetragonal crystal, there can be provided a piezoelectric element that efficiently utilizes 90° domain rotation and thus has high piezoelectric characteristics.

Hereinafter, specific examples of the present invention will be described as Examples 1 and 2. Further, for comparisons with Examples 1 and 2, Comparative Examples 1 to 3 also will be described.

Example 1

Figure 2A:
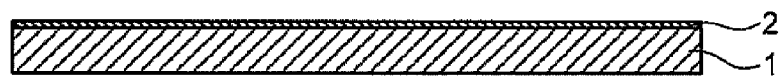
FIG. 2A is a sectional view showing one step of a process for forming a PLZT film as the above-described piezoelectric thin film.
Figure 2B:
FIG. 2B is a sectional view showing, another step of the process for forming the above-described PLZT film.
Figure 2C:
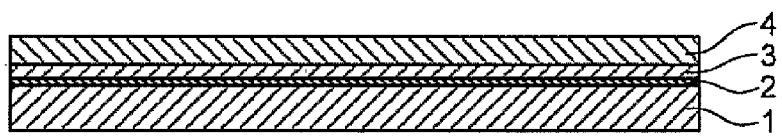
FIG. 2C is a sectional view showing still another step of the process for forming the above-described PLZT film.

FIGS. 2A to 2C are sectional views showing steps of a process for forming a PLZT film as a piezoelectric thin film according to this example. First, as shown in FIG. 2A, on a substrate 1 formed of a single crystal Si wafer having a thickness of about 400 μm, for example, a thermal oxidation film 2 of $SiO_2$ having a thickness of about 100 nm is formed. The substrate 1 may be of a standard type having a thickness of 300 μm to 725 μm, a diameter of 3 inches to 8 inches, and so on. Furthermore, the thermal oxidation film 2 can be formed by a method in which, by use of a wet oxidation furnace, the substrate 1 is exposed to a high temperature of about 1200° C. in an oxygen atmosphere.

Next, as shown in FIG. 2B, on the thermal oxidation film 2, an adhesion layer of Ti having a thickness of about 20 nm and a Pt electrode layer having a thickness of about 100 nm are formed in order. It is assumed that the adhesion layer and the Pt electrode layer are referred to collectively as a lower electrode 3. As these layers, Ti and Pt are formed into films by, for example, sputtering. Ti sputtering conditions used at this time are an Ar flow rate of 20 sccm, a pressure of 0.4 Pa, and RF power to be applied to a target of 200 W, and Pt sputtering conditions used at this time are an Ar flow rate of 20 sccm, a pressure of 0.4 Pa, RF power to be applied to a target of 150 W, and a substrate temperature of 530° C. Pt, due to its self-orientation property, is formed into a film having a <111> orientation and preferably has high crystallinity since it affects film quality of a PLZT film formed on Pt.

There is a possibility that when exposed to a high temperature in a later process step (of, for example, forming the PLZT film), Ti is diffused into the Pt film to form a hillock on a surface of the Pt layer and thus causes failures such as leakage of a driving current and deterioration in orientation property in the PLZT film. In order, therefore, to prevent such failures, the adhesion layer may be made of TiOx instead of Ti. TiOx can be formed into a film by reactive sputtering in which oxygen is introduced into Ti being sputtered, or by being heated, after formation of the Ti film, by use of an RTA (rapid thermal annealing) furnace, at about 700° C. in an oxygen atmosphere.

Next, as shown in FIG. 2C, on the substrate 1 with Pt formed thereover, a PLZT film 4 that is a piezoelectric thin film (ferroelectric film) is formed by sputtering. A method for forming the piezoelectric thin film is not limited to the sputtering and may be any other physical film formation method such as pulse laser deposition (PLD) or ion plating or any other chemical film formation method such as MOCVD or a sol-gel method.

Herein, as a target of the sputtering a target having a molar ratio between Zr and Ti (Zr/Ti ratio) of 50/50 and an added amount (substituting amount) of La with respect to Pb of 1% was used. That is, the PLZT film 4 was formed by using a target satisfying x=0.01 where a molar ratio between Pb and La (Pb/La ratio) was (1−x)/x.

Furthermore, since Pb contained in the target is likely to be re-evaporated at the time of high-temperature film formation, it is likely that a resulting thin film is Pb-deficient. For this reason, preferably, in the target, Pb is added in an amount somewhat larger than an amount based on a stoichiometric ratio of a perovskite crystal. For example, an added amount of Pb, though it depends also on a film formation temperature, preferably is increased by 10% to 30% than the amount based on the stoichiometric ratio.

PLZT sputtering conditions are an Ar flow rate of 25 sccm, an $O_2$ flow rate of 0.4 sccm, a pressure of 0.4 Pa, a substrate temperature of 600° C., and RF power of 500 W. Under these sputring conditions, the PLZT film 4 having a thickness of 4 μm was formed.

Figure 3:
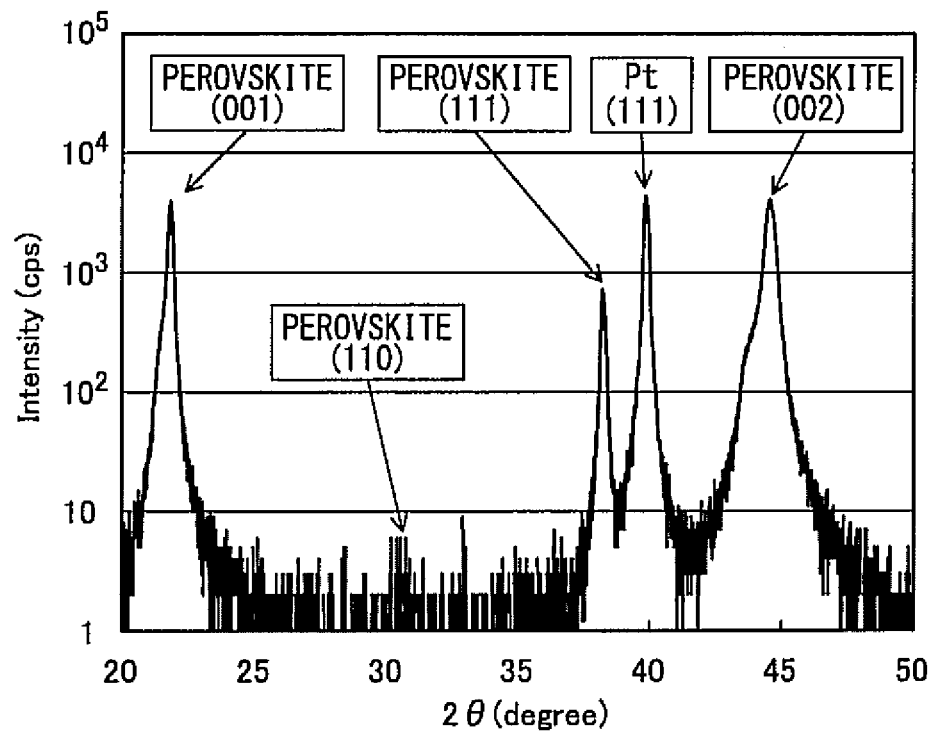
FIG. 3 is a graph showing a result of an XRD 2θ/θ measurement with respect to the above-described PLZT film.

FIG. 3 shows a result of an XRD (X-ray diffraction) 2θ/θ measurement with respect to the PLZT film 4 according to Example 1. In FIG. 3, an intensity (a diffraction intensity, a reflection intensity) on a vertical axis is indicated in terms of an X-ray counting rate per second (cps; count per second).

Herein, the X-ray diffraction 2θ/θ measurement is a technique in which an X-ray is made to enter a sample at an angle of θ (at an angle of θ with respect to a crystal plane) from a horizontal direction, and of the X-ray reflected from the sample, an X-ray component at an angle of 2θ with respect to the X-ray that has entered is detected and used to determine a variation in intensity with respect to θ. In diffraction using an X-ray, when Bragg's condition (2d sin θ=nλ (λ: wavelength of the X-ray, d: atomic inter-planar spacing of a crystal, n: integer)) is met, a diffraction intensity increases, and an inter-planar spacing (lattice constant) of the crystal at that time is in correlation with 2θ described above. Thus, based on a value of 2θ at which the diffraction intensity increases, a crystal structure (a tetragonal crystal, a rhombohedral crystal, or the like) and an orientation-property (for example, a (100) orientation degree) of the sample that the X-ray has entered can be grasped. The (100) orientation degree refers to a ratio of crystals oriented such that a (100) plane thereof is parallel to the substrate to entire crystals constituting the film.

Figure 4:
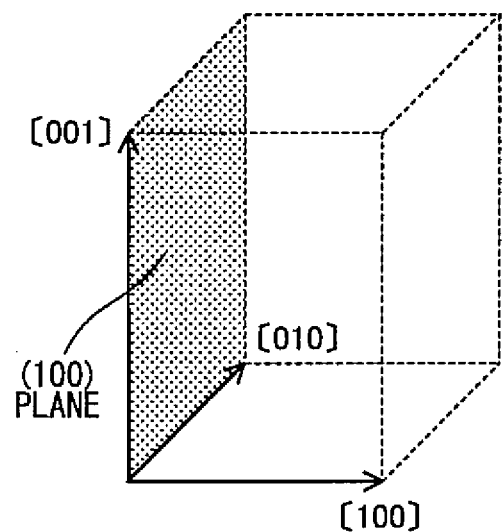
FIG. 4 is a perspective view schematically showing a (100) plane of a tetragonal crystal.
Figure 5:
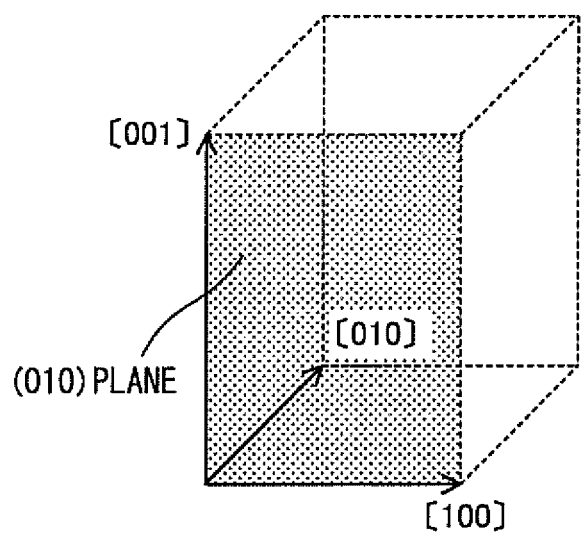
FIG. 5 is a perspective view schematically showing a (010) plane of the tetragonal crystal.
Figure 6:
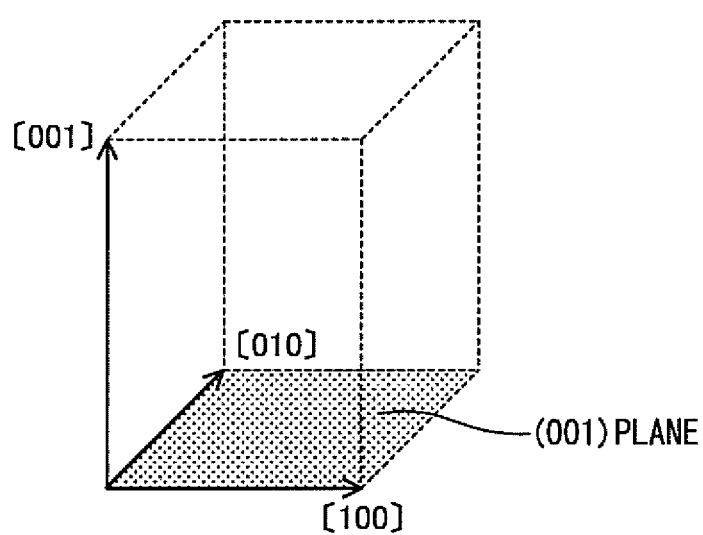
FIG. 6 is a perspective view schematically showing a (001) plane of the tetragonal crystal.
Figure 7:
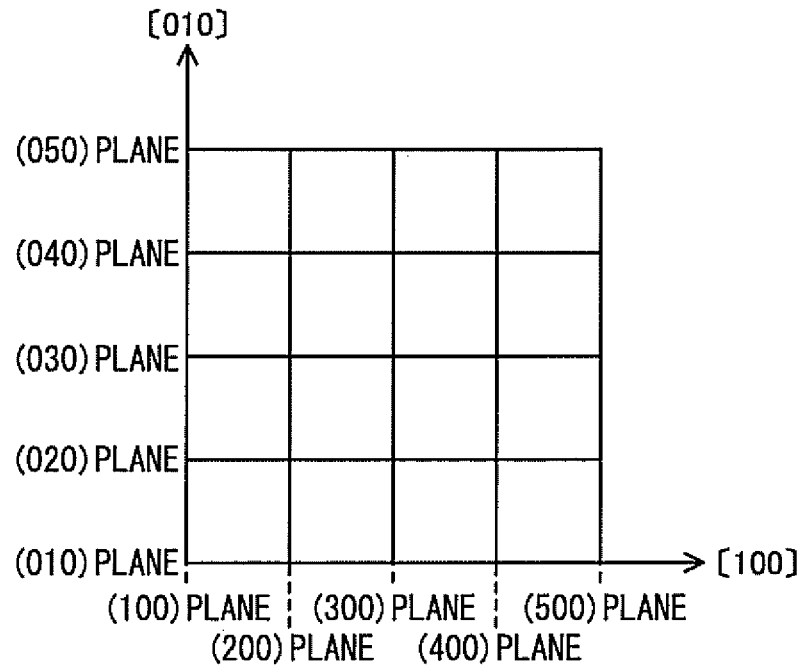
FIG. 7 is an explanatory view showing an inter-planar spacing in a [100] direction and an inter-planar spacing in a [010] direction in the tetragonal crystal.
Figure 8:
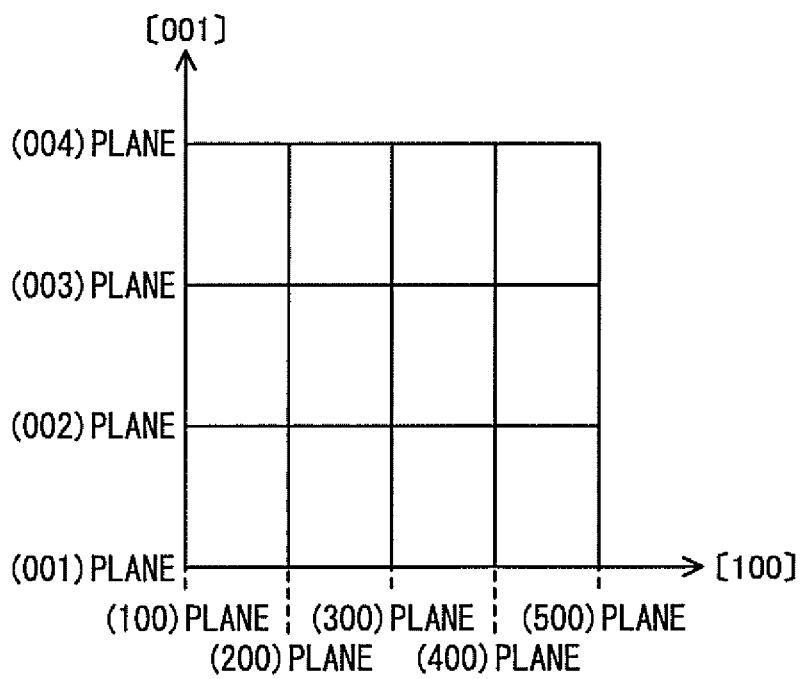
FIG. 8 is an explanatory view showing an inter-planar spacing in the [100] direction and an inter-planar spacing in a [001] direction in the tetragonal crystal.

Herein, in calculating the (100) orientation, degree of the PLZT film 4, peak intensities of plane orientations of a perovskite crystal determined by the X-ray diffraction are defined as follows. FIGS. 4 to 6 schematically show a (100) plane, a (010) plane, and a (001) plane of a tetragonal crystal. Furthermore, FIG. 7 shows an inter-planar spacing in a [100] direction and an inter-planar spacing in a [010] direction, and FIG. 8 shows an inter-planar spacing in the [100] direction and an inter-planar spacing in a [001] direction. As shown therein, in the tetragonal crystal, while an inter-planar spacing in the [100] direction and an inter-planar spacing in the [010] direction are equal to each other, an inter-planar spacing in the [001] direction is different from these inter-planar spacings. Thus, as to peak intensities in a <100> axis direction in the X-ray diffraction, peak intensities in the [100] direction and a peak intensity in the [010] direction are indicated collectively by (100), and a peak intensity in the [001] direction is indicated by (001).

Furthermore, in the tetragonal crystal, as to peak intensities in a <110> axis direction in the X-ray diffraction, conceivably, inter-planar spacings in directions included in the <110> axis direction are all equivalent and thus are indicated by (110). Similarly, as to peak intensities in a <111> axis direction, inter-planar spacings in directions included in the <111> axis direction are all equivalent and thus are indicated by (111).

Where the peak intensities in the axis directions are defined as above, a (100) orientation degree A (%) of the tetragonal crystal of the PLZT film 4 can be expressed as follows:

$$A=(100)/\{(100)+(001)+(110)+(111)\}\times 100.$$

Based on the peak intensities shown in FIG. 3, the (100) orientation degree A of the tetragonal crystal was calculated by the above-described method and gave a result that A=82%. Furthermore, based on the peak intensities in the <100> axis direction, a ratio of the tetragonal crystal in the PLZT film 4 was determined to be 67%.

Figure 9:
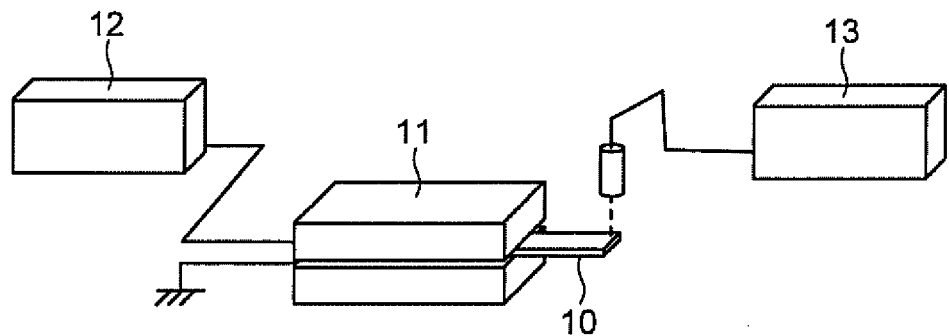
FIG. 9 is a perspective view showing a schematic configuration of a piezoelectric displacement measurement device.

Next on the above-described PLZT film 4, for example, Pt was sputtered to form an upper electrode 5 (see FIG. 12 and FIG. 13), and thus a piezoelectric element 10 was completed, which then was separated and taken out from a center of the wafer. By a cantilever method using a piezoelectric displacement measurement device shown in FIG. 9, a piezoelectric displacement thereof was measured, and based thereon, a piezoelectric constant $d_{31}$ was determined. As a result, the piezoelectric constant $d_{31}$ had a value of –210 pm/V.

In the above-described piezoelectric displacement measurement device, a cantilever structure was formed in which the piezoelectric element 10 was cramped at its end portion by a fastening portion 11 such that a movable length of a cantilever was 10 mm. By using a function generator 12, at a frequency of 500 Hz, a voltage of 0 V at the maximum was applied to the upper electrode 5, while a voltage of –20 V at the minimum was applied to the lower electrode 3, and a displacement of the end portion of the piezoelectric element 10 was observed by using a laser Doppler vibration meter 13. Then, based on a piezoelectric displacement thus obtained, the piezoelectric constant $d_{31}$ was determined by a known technique.

Example 2

In this example, on a wafer fabricated up to a stage where a lower electrode 3 had been formed in a manner similar to Example 1, by using a target having a molar ratio between Zr and Ti (Zr/Ti ratio) of 52/48 and an added amount (substituting amount) of La with respect to Pb of 7%, a PLZT film 4 was formed by sputtering. That is, by using a target satisfying x=0.07 where a molar ratio between Pb and La (Pb/La ratio) was (1−x)/x, the PLZT film 4 was formed. PLZT sputtering conditions used at this time were an Ar flow rate of 30 sccm, an $O_2$ flow rate of 0.4 sccm, a pressure of 0.4 Pa, a substrate temperature of 620° C., and RF power of 500 W. Under these sputter conditions, the PLZT film 4 having a thickness of 4 μm was formed. After that, by a technique similar to that used in Example 1, an upper electrode 5 was formed on the PLZT film 4, and thus a piezoelectric element 10 was completed.

With respect to the PLZT film 4 and the piezoelectric element 10, which were thus formed, similarly to Example 1, a crystal structure evaluation using an XRD and a measurement of a piezoelectric constant $d_{31}$ were performed. As a result, a (100) orientation degree A of the film thus obtained was found to be 94%, a ratio of a tetragonal crystal in the film was found to be 90%, and a value of the piezoelectric constant $d_{31}$ was found to, be –245 pm/V. Conceivably, the reason that the piezoelectric constant $d_{31}$ had such an excellent value is that, since the (100) orientation degree A was improved, a region in the film in which polarization rotation could be utilized was increased.

Comparative Example 1

In this comparative example, on a wafer fabricated up to a stage where a lower electrode had been formed in a manner similar to Example 1, by using a target similar to Example 1, a PLZT film was formed by sputtering, PLZT sputtering conditions used at this time were an Ar flow rate of 25 sccm, an $O_2$ flow rate of 0.4 sccm, a pressure of 0.4 Pa, a substrate temperature of 500° C., and RF power of 500 W. Under these sputtering conditions, the PLZT film having a thickness of 4 μm was formed. After that, by a technique similar to that used in Example 1, an upper electrode was formed on the PLZT film, and thus a piezoelectric element was completed.

With respect to the PLZT film and the piezoelectric element, which were thus formed, similarly to Example 1, a crystal structure evaluation using an XRD and a measurement of a piezoelectric constant $d_{31}$ were performed. As a result, a (100) orientation degree A of the film thus, obtained was found to be 26%, and a value of the piezoelectric constant $d_{31}$ was found to be –120 pm/V.

Comparative Example 2

In this comparative example, on a wafer fabricated up to a stage where a lower electrode had been formed in, a manner similar to Example 1, by using a target having a molar ratio between Zr and Ti (Zr/Ti ratio) of 52/48, a PZT film was formed by sputtering. After that, by a technique similar to that used in Example 1, an upper electrode was formed on the PZT film, and thus a piezoelectric element was completed.

With respect to the PZT film and the piezoelectric element, which were thus formed, similarly to Example 1, a crystal structure evaluation using an XRD and a measurement of a piezoelectric constant $d_{31}$ were performed. As a result, a (100) orientation degree A of the film thus obtained was found to be 90%, and a value of the piezoelectric constant $d_{31}$ was found to be −170 pm/V.

Comparative Example 3

In this comparative example, on a wafer fabricated up to a stage where a lower electrode had been formed in a manner similar to Example 1, by using a target having a molar ratio between Zr and Ti (Zr/Ti ratio) of 52/48 and an added amount (substituting amount) of La with respect to Pb of 11%, a PLZT film was formed by sputtering. That is, by using a target satisfying x=0.11 (11%) where a molar ratio between Pb and La (Pb/La ratio) was (1−x)/x, the PLZT film was formed. After that, by a technique similar to that used in Example 1, an upper electrode was formed on the PLZT film, and thus a piezoelectric element was completed.

With respect to the PLZT film and the piezoelectric element, which were thus formed, similarly to Example 1, a crystal structure evaluation using an XRD and a measurement of a piezoelectric constant $d_{31}$ were performed. As a result, a (100) orientation degree A of the film thus obtained was found to be 42%, and a value of the piezoelectric constant $d_{31}$ was found to be −60 pm/V.

Furthermore in this comparative example, a crack was produced on a surface of the PLZT film formed, and as a result of performing an XRD evaluation, in addition to a peak derived from the perovskite structure, a peak derived from a pyrochlore structure also was observed.

(Discussion)

Table 1 shows a summary of results of the XRD evaluation ((100) orientation degree) and the piezoelectric characteristic evaluation (piezoelectric constant $d_{31}$) of the PLZT films and the PZT film fabricated in the foregoing examples and comparative examples. Furthermore, FIG. 10 is a graph in which the results shown in Table 1 are plotted.

TABLE 1

|  | (100) Orientation Degree (%) | Piezoelectric Constant $d_{31}$ (pm/V) |
|---|---|---|
| Example 1 | 82 | −210 |
| Example 2 | 94 | −245 |
| Comparative Example 1 | 26 | −120 |
| Comparative Example 2 | 90 | −170 |
| Comparative Example 3 | 42 | −60 |

Figure 10:
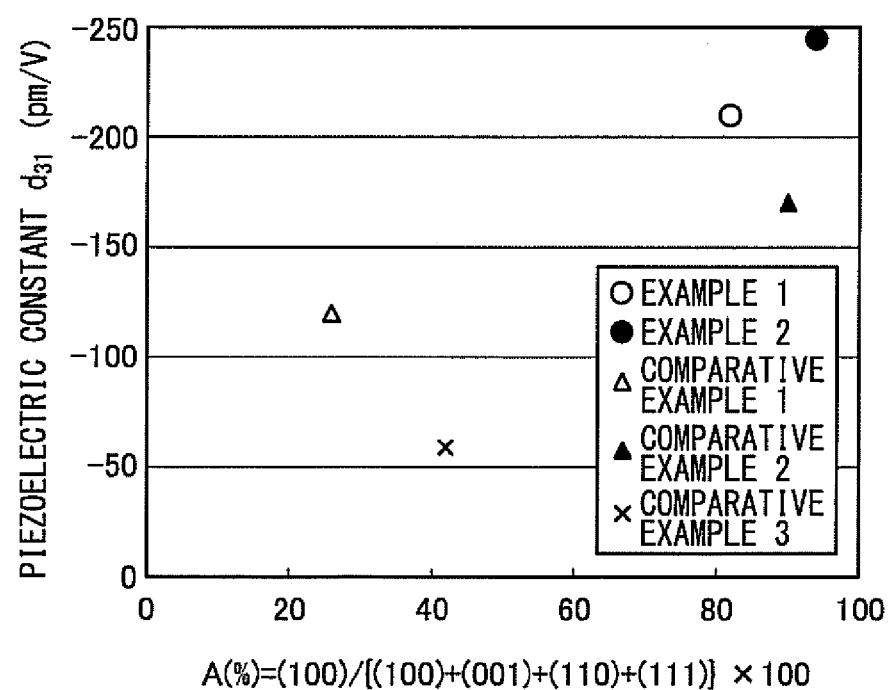
FIG. 10 is a graph showing a relationship between a (100) orientation degree and a piezoelectric constant.

As shown in Table 1 and FIG. 10, Examples 1 and 2 having values of the (100) orientation degree of 80% or higher each have an absolute value of the piezoelectric constant $d_{31}$ higher than 180 pm/V, and thus it can be said that in these examples, 90° domain rotation of a tetragonal crystal is utilized to enhance piezoelectric characteristics. Example 2, in particular, has a value of the (100) orientation degree of 90% or higher, and thus it can be said that in this example, 90° domain rotation is further utilized to further enhance the piezoelectric characteristics.

Furthermore, a comparison between Example 2 and Comparative Example 2 indicates that, although these examples both have values of the (100) orientation degree of 90% or higher, the PLZT film (Example 2) to which La has been added provides piezoelectric characteristics 1.5 times higher than those of the PZT film (Comparative Example 2) to which La has not been added. Conceivably, this is because, in the PZT film to which La has not been added, 90° domain rotation is not being caused efficiently.

Furthermore, in Comparative Example 3, in addition to the perovskite structure, the pyrochlore structure also has appeared. Conceivably, this is because an La added amount (substituting amount) with respect to PZT exceeds 10%, and a part of La that has not been incorporated into a perovskite crystal flocculates and bonds with another element to form a compound having the pyrochlore structure. As thus described, an added amount of La with respect to PZT exceeding 10% makes it impossible to obtain a perovskite single-phase film, and thus it can be said that an added amount of La is preferably 10% or lower.

(Summary)

As described thus far, in a case where a piezoelectric thin film is made of perovskite-type PLZT having a tetragonal crystal, and the tetragonal crystal has a (100) orientation degree of 80% or higher, 90° domain rotation of the tetragonal crystal is utilized, and the 90° domain orientation is caused reversibly and efficiently (by using low energy), so that piezoelectric characteristics can be enhanced. Furthermore, adding La to PZT makes it unlikely that oxygen, defects occur in the crystal, so that deterioration in leakage characteristic can be prevented, and thus it is also possible to secure excellent reliability for a long period of time. Particularly in a case where, as in Example 2, a tetragonal crystal has a (100) orientation degree of 90% or higher, 90° domain rotation of the tetragonal crystal is further utilized to be able to reliably obtain the above-described effect.

Furthermore, in this embodiment, by using a commonly used substrate (for example, an Si substrate), the piezoelectric thin film (PLZT film 4) is formed thereon, and thus 90° domain rotation can be caused reversibly and efficiently, so that in order to reversibly and efficiently cause the 90° domain rotation, unlike in a conventional case, it is not required that a specific type of substrate (a single crystal substrate with a surface on which a crystal plane is inclined) be used so that an orientation axis is inclined. Thus, in no case does anisotropy occur in the piezoelectric thin film, and it becomes possible, at the time of fabricating a device (piezoelectric element 10) in a later process step, to perform uniform patterning by etching. This can suppress a decrease in device productivity.

Furthermore, in a conventional configuration in which an orientation axis (polarization direction) of a piezoelectric body is inclined from a direction perpendicular to a substrate, since a direction in which a piezoelectric displacement is maximally increased is an orientation axis direction, the piezoelectric displacement cannot be increased to the maximum in the direction perpendicular to the substrate. In this embodiment, however, the orientation axis is inclined in a perpendicular direction to the substrate, and thus an increase in amount of a displacement by 90° domain rotation can be maximally utilized.

Figure 11:
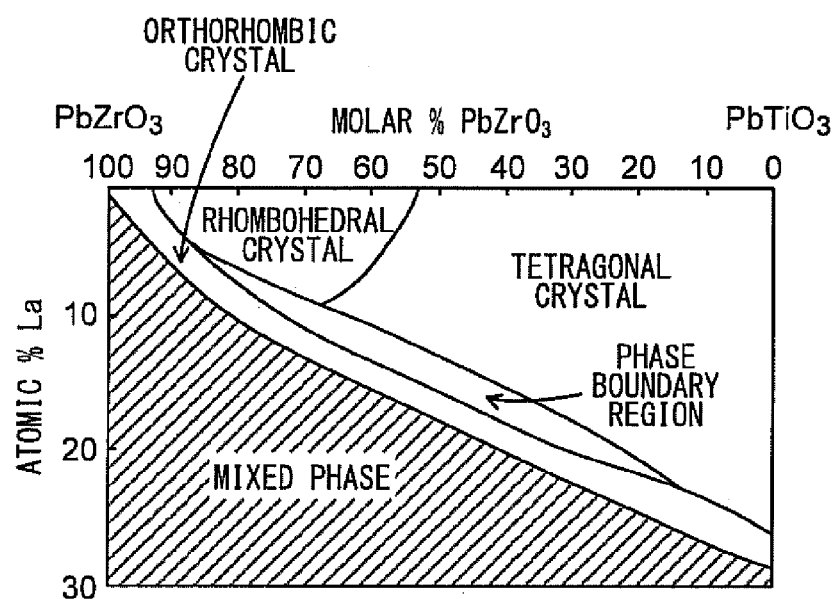
FIG. 11 is a graph showing a relationship between an added amount of La in PLZT and a crystal system.

Furthermore, FIG. 11 shows a phase diagram of PLZT. In this figure, a vertical axis indicates an added amount of La in terms of a ratio of an atomicity of La (atomic %) to a sum of atomicities of Zn and Ti (a sum of atomicities of Pb and La). Based on this figure, a phase boundary between a tetragonal crystal and a rhombohedral crystal varies depending on the added amount of La, and thus even when the Zr/Ti ratio is made to vary depending on the added amount of La from 52/48, which represents a typical MPB composition, PLZT still can beset to have a crystal structure of the tetragonal crystal. On the other hand, when the added amount of La exceeds 10%, the crystal structure approximates a mixed phase and thus turns into a structure in which a perovskite single phase is unlikely to be obtained. The above-described mixed phase refers to a region in which the perovskited single phase cannot be obtained due to an excessive added amount of La causing, for example, the pyrochlore structure to appear and La to be precipitated.

Thus, it can be said that, depending on the added amount of La, the Zr/Ti ratio could be made to vary in a range of 50/50 to 55/45 within such a range that the tetragonal crystal can be obtained. In other words, by setting the Zr/Ti ratio to be in a range of not less than 50/50 and not more than 55/45 depending on a Pb/La ratio, it is possible to reliably realizing a perovskite-type piezoelectric thin film that utilizes 90° domain rotation of the tetragonal crystal and thus can provide enhanced piezoelectric characteristics.

Furthermore, when, as in Comparative Example 3, the La added amount with respect to PZT exceeds 10%, in the crystal, the perovskite structure collapses (the pyrochlore structure appears), so that it becomes difficult to obtain excellent piezoelectric characteristics. Thus, by setting the La added amount to 10% or lower as in Examples 1 and 2, it is possible to reliably realize a piezoelectric thin film having the perovskite structure and to obtain excellent piezoelectric characteristics. That is, where a molar ratio between Pb and La in PLZT is set to a Pb/La ratio of $(1-x)/x$, by satisfying $$0 < x \leq 0.1,$$

excellent piezoelectric characteristics can be obtained.

By the way, the perovskite-type piezoelectric thin film according to this embodiment may include a rhombohedral crystal. Also in that case, when a ratio of the tetragonal crystal in the piezoelectric thin film is 60% or higher, an effect of enhancing piezoelectric characteristics by utilizing 90° domain rotation of the tetragonal crystal can be reliably obtained, and when the above-described ratio is 90% or higher, this effect can be further reliably obtained. In this respect, the above-described ratio is 67% in Example 1 and 90% in Example 2, and thus in each of Examples 1 and 2, the effect of enhancing piezoelectric characteristic by utilizing 90° domain rotation of the tetragonal crystal can be reliably obtained, and, particularly in Example 2, this effect can be further reliably obtained.

In each of Examples 1 and 2 noted above, PLZT having a (100) orientation degree of 80% or higher is fabricated by using a film formation temperature of PLZT as high as 60° C. or higher. A method for increasing the (100) orientation degree, however, is not limited thereto. For example, the (100) orientation degree of PLZT may be increased by a method in which a perovskite material that is likely to be (100)-oriented, such as $LNO(LaNiO_3)$, $PTO(PbTiO_3)$, or $PLT(Pbt_{1-x}La_xTiO_3)$, is used to form a seed layer for orientation control, and PLZT is formed into a film on the seed layer.

(Regarding Application Example of PLZT Film)

As noted above, the PLZT film 4 shown in each of Examples 1 and 2 can be formed by using a commonly used Si wafer without using a specific type of substrate with a surface on which a crystal plane is inclined, and thus it is also made easy to apply the PLZT film 4 to MEMS. The following describes an example in which the PLZT film 4 is applied to a piezoelectric element fabricated by using MEMS technology.

Figure 12:
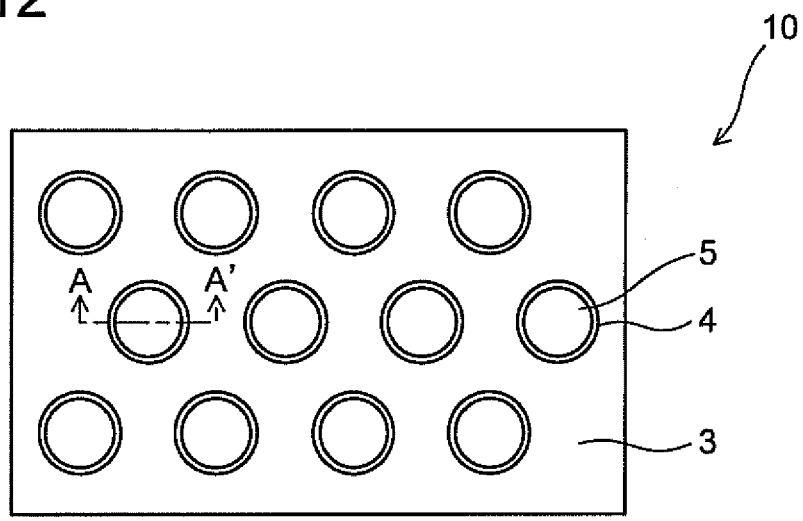
FIG. 12 is a plan view showing a configuration of a piezoelectric element including a PLZT film according to each of Examples.
Figure 13:
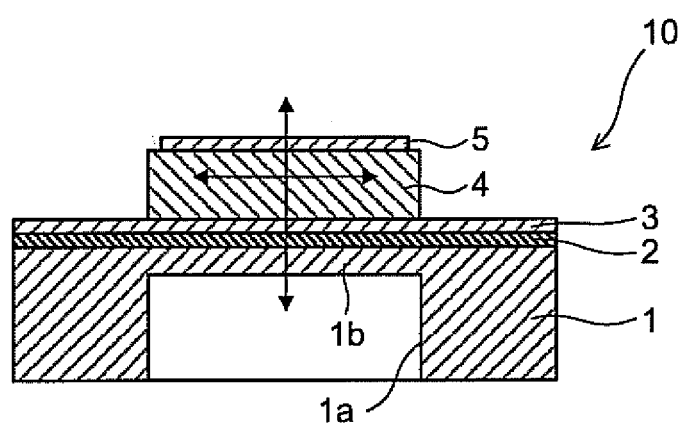
FIG. 13 is a sectional view taken along line A-A' in FIG. 12.

FIG. 12 is a plan view showing a configuration of a diaphragm, as a piezoelectric element 10 fabricated by using the MEMS technology, to which the PLZT film 4 according, to each of Examples 1 and 2 is applied, and FIG. 13 is a sectional view taken along line A-A' in FIG. 12. The piezoelectric element 10 is formed by layering on a substrate 1, a thermal oxidation film 2, a lower electrode 3, a PLZT film 4 as a piezoelectric thin film, and an upper electrode 5 in this order. In each desired region on the substrate 1, the PLZT film 4 is arranged in a two-dimensional zigzag pattern.

Furthermore, in the substrate 1, a region corresponding to the region in which the PLZT film 4 is formed is configured as a concave portion 1a formed by removing a part of the substrate 1 in a thickness direction thereof in a circular shape in cross section, and a thin plate-shaped region 1b remains above the concave portion 1a (on a bottom side of the concave portion 1a) in the substrate 1. The lower electrode 3 and the upper electrode 5 are connected to an external control circuit via unshown wiring.

By applying an electric signal from the control circuit to each of the lower electrode 3 and the upper electrode 5 sandwiching the predetermined PLZT film 4 therebetween, only the predetermined PLZT film 4 can be driven. That is, when a predetermined electric field is applied to each of the upper and lower electrodes sandwiching the PLZT film 4 therebetween, the PLZT film 4 expands and contracts in a lateral direction, and due to a bimetal effect, the PLZT film 4 and the region 1b of the substrate 1 become bent up and down. Thus, when the concave portion 1a of the substrate 1 is filled with a gas or a liquid, the piezoelectric element 10 can be used as a pump and thus is suitably used in, for example, an ink-jet head.

Furthermore, an electric charge amount of the predetermined PLZT film 4 is detected via the lower electrode 3 and the upper electrode 5, and thus a deformation amount of the PLZT film 4 also can be detected. That is, when the PLZT film 4 vibrates in response to sound waves or ultrasonic waves, due to an effect opposite to the above-described effect, an electric field is generated between the upper and lower electrodes, and a magnitude of the electric field generated at this time and a frequency of a detection signal are detected, and thus the piezoelectric element 10 can be used also as a sensor (ultrasonic sensor). Furthermore, the PLZT film 4 exerts a pyroelectric effect, and thus the piezoelectric element 10 can be used also as a pyroelectric sensor (infrared sensor).

In addition to the above, by utilizing a piezoelectric effect of the PLZT film 4, the piezoelectric element 10 can be used also as a frequency filter (surface-acoustic-wave filter), and since the PLZT film 4 is a ferroelectric body, the piezoelectric element 10 can be used also as an involatile memory.

Figure 14:
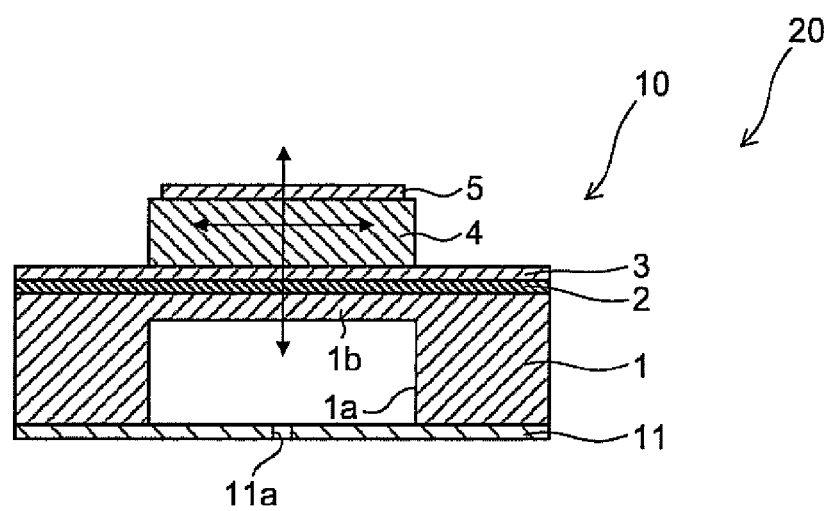
FIG. 14 is a sectional view of an ink-jet head including the above-described piezoelectric element.

A supplementary explanation of the above-described ink-jet head will now be given. FIG. 14 is a sectional view of an ink-jet head 20 including the piezoelectric element 10. The ink-jet head 20 is formed by bonding (for example, anodically bonding), to the substrate 1 of the piezoelectric element 10, a nozzle plate 11 via an unshown glass plate. The nozzle plate 11 has a nozzle opening 11a, and via the nozzle opening 11a, the concave portion 1a formed in the substrate 1 communicates with the exterior. Furthermore, the concave portion 1a communicates with an unshown ink supply path and functions as a pressure chamber in which ink supplied through the ink supply path is housed. In this configuration, a voltage is applied to each of the lower electrode 3 and the upper electrode 5 so that the PLZT film 4 and the region 1b of the substrate 1 become bent and thus causes pressure to be applied to the ink in the concave portion 1a. This allows the above-described ink to be ejected to the exterior via the nozzle opening 11a.

Figure 15:
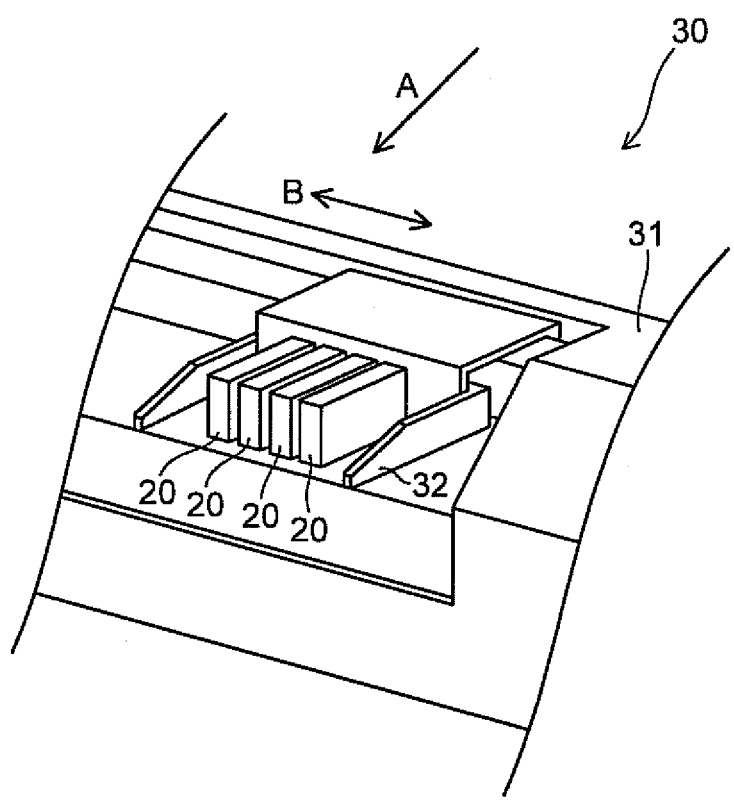
FIG. 15 is a perspective-view in an enlarged scale showing a part of an ink-jet printer including the above-described ink-jet head.

Furthermore, FIG. 15 is a perspective view in an enlarged scale showing a part of an ink-jet printer 30 including the above-described ink-jet head 20. The ink-jet printer 30 has, in a housing 31 that is partly open, a carriage 32 that is movable in a lateral direction (a B direction in the figure). On the carriage 32, the ink-jet heads 20 corresponding to a plurality of colors (for example, four colors of yellow, magenta, cyan, and black), respectively, are mounted in a row. While an unshown recording medium is conveyed from a back side toward a forward side of the printer (an A direction in the figure), the carriage 32 is moved laterally and the various colors of ink are ejected from, the ink-jet heads 20 corresponding thereto, respectively, so that a color image can be formed on the recording medium.

The piezoelectric thin film described thus far is a perovskite-type piezoelectric thin film having a crystal structure of a tetragonal crystal. A (100) orientation degree of the tetragonal crystal is 80% or higher, and the piezoelectric thin film is made of PLZT obtained by substituting La for a part of Pb in PZT.

According to the above-described configuration, in the piezoelectric thin film, the (100) orientation degree of the tetragonal crystal is 80% or higher, and thus it is possible to increase an effect of significantly enhancing piezoelectric characteristics by utilizing 900 domain rotation of the tetragonal crystal.

Furthermore, the piezoelectric thin film is made of PLZT, and La is substituted for a part of Pb therein, and thus even in a case where lead deficiency occurs when the piezoelectric thin film is formed at a high temperature, it becomes unlikely that oxygen defects result therefrom. To be specific, in a perovskite crystal, an La atom is present in a trivalent cation state, and a Pb atom is present in a bivalent cation state, and thus compared with PZT, PLZT has a larger amount of positive electric charge. Because of this, even in a case where an O atom is not lost, while the Pb atom is lost through evaporation when the piezoelectric thin film is being formed at a high temperature, it becomes easier for the crystal to maintain electric charge neutrality.

As described above, it becomes unlikely that oxygen defects occur in the crystal, and thus pinning of domains resulting from the oxygen defects can be suppressed. This makes it possible to reversibly cause 90° domain rotation. In addition, it has been found by quantum computation that, in (100)-oriented PLZT, compared with PZT, energy required to cause 90° domain, rotation is lower. Thus, 90° domain rotation can be caused efficiently.

That is, according to the above-described configuration, also in a case of utilizing 90° domain rotation of a tetragonal crystal, it is possible to reversibly and efficiently cause the 90° domain rotation and thus to enhance piezoelectric characteristics. Furthermore, it becomes unlikely that oxygen defects occur in the crystal, and thus deterioration in leakage characteristic is prevented, so that excellent reliability can be secured for a long period of time.

Furthermore, the piezoelectric thin film is made of PLZT, and thus even with a high (100) orientation degree, 90° domain rotation can be caused reversibly and efficiently as described above. Thus, also in a case of forming a device (piezoelectric element) by forming the above-described piezoelectric thin film over a substrate, unlike in a conventional case, there is no need to use a specific type of substrate (a single crystal substrate with a surface on which a crystal plane is inclined) so that an orientation axis is inclined. Consequently, no anisotropy occurs in a piezoelectric body, and this enables uniform patterning by etching, so that a decrease in device productivity can be suppressed.

In the above-described piezoelectric thin film, depending on a molar ratio between Pb and La, a Zr/Ti ratio that is a molar ratio between Zr and Ti in the PLZT may be set to be in a range of not less than 50/50 and not more then 55/45

Even when, depending on the Pb/La ratio, the Zr/Ti ratio is made to vary within the above-describe range, PLZT having a perovskite structure of a tetragonal crystal can be realized. Thus, by utilizing 90° domain rotation of the tetragonal crystal, piezoelectric characteristics can be reliably enhanced.

In the above-described piezoelectric thin film, preferably, where a molar ratio between Pb and La in the PLZT is defined as a Pb/La ratio of $(1-x)/x$, $$0 < x \leq 0.1$$

is satisfied.

When x>0.1, i.e. an added amount (substituting amount) of La added to replace Pb to be in an A site of a perovskite structure exceeds 10%, in the crystal, the perovskite structure collapses, so that it becomes difficult to obtain excellent piezoelectric characteristics. Thus, by setting the La added amount to 10% or lower, it is possible to reliably realize a piezoelectric thin film having a perovskite structure and to obtain excellent piezoelectric characteristics.

In the above-described piezoelectric thin film, the (100) orientation degree of the tetragonal crystal may be 90% or higher.

In this case, the 90° domain rotation of the tetragonal crystal can be further utilized, and thus piezoelectric characteristics can be further enhanced.

In the above-described piezoelectric thin film, preferably, a ratio of the tetragonal crystal in the piezoelectric thin film is 60% or higher.

In this case, an effect of enhancing piezoelectric characteristics by utilizing the 90° domain rotation of the tetragonal crystal can be reliably obtained.

In the above-described piezoelectric thin film, preferably, the ratio of the tetragonal crystal in the piezoelectric thin film is 90% or higher.

In this case, the effect of enhancing piezoelectric characteristics by utilizing the 90° domain rotation of the tetragonal crystal can be further reliably obtained.

The piezoelectric element described thus far is a piezoelectric element in which a piezoelectric thin film is formed over a substrate, and the piezoelectric, thin film is the piezoelectric thin film having the above-noted configuration.

By using the piezoelectric thin film having the above-noted configuration, without the need to use a specific type of substrate (a single crystal substrate with a surface on which a crystal plane is inclined) used in a conventional case, piezoelectric characteristics can be enhanced. As thus described, there is no need for a specific type of substrate, for enhancing piezoelectric characteristics, and thus a decrease in productivity of a piezoelectric element can be suppressed.

INDUSTRIAL APPLICABILITY

The above-noted piezoelectric thin film is applicable to, for example, a MEMS actuator (an actuator for an ink-jet printer or a projector), a MEMS sensor (a pyroelectric sensor, an ultrasonic sensor), a frequency filter, and an involatile memory.

LIST OF REFERENCE SYMBOLS 1 substrate
1a, concave portion (pressure chamber)
4 PLZT film (piezoelectric thin film)
10 piezoelectric element
11a nozzle opening
20 ink-jet head
30 ink-jet printer

The invention claimed is:

1. A piezoelectric thin film of a perovskite type comprising a crystal structure of a tetragonal crystal, to which an electric field is applied in [001] direction,
wherein
a (100) orientation degree of the tetragonal crystal is 80% or higher,
the ratio of the tetragonal crystal to all crystals in the piezoelectric thin film is 67% or higher,
the piezoelectric thin film is made of lead lanthanum zirconate titanate (PLZT) obtained by substituting La for a part of Pb in PZT, and
90° domain rotation of the tetragonal crystal is capable of being caused when the electric field is applied.

2. The piezoelectric thin film according to claim 1, wherein depending on a molar ratio between Pb and La, a Zr/Ti ratio that is a molar ratio between Zr and Ti in the PLZT is set to be in a range of not less than 50/50 and not more then 55/45.

3. The piezoelectric thin film according to claim 1, where a molar ratio between Pb and La in the PLZT is defined as a Pb/La ratio of $(1-x)/x$, $0.07 \leq x \leq 0.1$ is satisfied.

4. The piezoelectric thin film according to claim 1, wherein the (100) orientation degree of the tetragonal crystal is 90% or higher.

5. A piezoelectric element, comprising:
a substrate; and
a piezoelectric thin film formed over the substrate,
wherein
the piezoelectric thin film is the piezoelectric thin film according to claim 1.

6. An ink-jet head, comprising:
the piezoelectric element according to claim 5;
a pressure chamber for housing ink, which is formed in the substrate; and
a nozzle opening that communicates from the pressure chamber to an exterior, wherein the piezoelectric element is used to eject the ink through the nozzle opening.

7. An ink-jet printer, comprising: the ink jet head according to claim 6.

8. The piezoelectric thin film according to claim 1, wherein said piezoelectric thin film is formed on the upper surface of a Pt electrode layer having a (111) orientation.

9. The piezoelectric thin film according to claim 1, wherein the PLZT is represented by $(Pb_{(1-x)}La_{(x)})(Zr_{(100-y)}Ti_{(y)})O_3$, where $0.01 \leq x \leq 0.07$ and $45 \leq y \leq 50$.

10. The piezoelectric thin film according to claim 1, wherein
the 90° domain rotation occurs reversibly.

11. A method for manufacturing the piezoelectric thin film according to claim 1, wherein
the piezoelectric thin film is formed by sputtering.

12. The method for manufacturing the piezoelectric thin film according to claim 11, wherein
the film formation temperature of the piezoelectric thin film is 500° C. or higher but 700° C. or lower.

13. The method for manufacturing the piezoelectric thin film according to claim 11, wherein
the piezoelectric thin film is formed on a seed layer on a Pt electrode layer.

14. The method for manufacturing the piezoelectric thin film according to claim 11, wherein
the seed layer is formed of one of LNO, PTO, and PLT.

* * * * *